United States Patent
Arico et al.

(10) Patent No.: US 7,332,195 B2
(45) Date of Patent: Feb. 19, 2008

(54) CHEMICAL VAPOR DEPOSITION METHOD

(75) Inventors: Alan A. Arico, South Bend, IN (US); David E. Parker, Granger, IN (US); Akshay Waghray, Granger, IN (US); Brian Miller, Mishawaka, IN (US); David W. Shaw, Niles, MI (US)

(73) Assignee: Honeywell International Inc., Morristown, NJ (US)

( * ) Notice: Subject to any disclaimer, the term of this patent is extended or adjusted under 35 U.S.C. 154(b) by 237 days.

(21) Appl. No.: 10/926,889

(22) Filed: Aug. 26, 2004

(65) Prior Publication Data

US 2006/0046059 A1  Mar. 2, 2006

(51) Int. Cl.
*C23C 16/22* (2006.01)

(52) U.S. Cl. .................. 427/249.2; 427/249.4; 427/255.12; 427/900

(58) Field of Classification Search ............ 427/249.2, 427/249.4, 255.12, 900
See application file for complete search history.

(56) References Cited

U.S. PATENT DOCUMENTS

| | | | | |
|---|---|---|---|---|
| 5,035,921 A | * | 7/1991 | Berneburg et al. | 427/226 |
| 5,348,774 A | * | 9/1994 | Golecki et al. | 427/543 |
| 5,480,678 A | | 1/1996 | Rudolph et al. | |
| 5,705,008 A | * | 1/1998 | Hecht | 156/148 |
| 5,705,106 A | * | 1/1998 | Kolesnikov et al. | 264/29.1 |
| 5,740,593 A | * | 4/1998 | Sheehan et al. | 28/113 |
| 5,882,726 A | * | 3/1999 | Sheehan | 427/228 |
| 5,904,957 A | * | 5/1999 | Christin et al. | 427/248.1 |
| 5,981,827 A | * | 11/1999 | Devlin et al. | 623/23.51 |
| 6,077,464 A | * | 6/2000 | Murdie et al. | 264/29.5 |
| 6,083,436 A | | 7/2000 | Thompson et al. | |
| 6,109,209 A | | 8/2000 | Rudolph et al. | |
| 6,151,447 A | | 11/2000 | Moore et al. | |
| 6,346,304 B1 | * | 2/2002 | Fisher et al. | 427/595 |
| 6,416,824 B2 | * | 7/2002 | Fisher et al. | 427/590 |
| 6,537,470 B1 | * | 3/2003 | Wood et al. | 264/29.5 |
| 6,669,988 B2 | | 12/2003 | Daws et al. | |
| 6,780,462 B2 | * | 8/2004 | Purdy et al. | 427/248.1 |
| 2003/0035893 A1 | * | 2/2003 | Daws et al. | 427/255.28 |
| 2003/0118728 A1 | | 6/2003 | Sion et al. | |

FOREIGN PATENT DOCUMENTS

JP  11-50101 A  2/1999
WO  WO-2005/056262 A2  6/2005

* cited by examiner

*Primary Examiner*—Bret Chen
(74) *Attorney, Agent, or Firm*—Birch, Stewart, Kolasch & Birch, LLP (57) ABSTRACT

Method for densifying a porous carbon preform (5). The method includes the steps of: (a) providing the apparatus (11); (b) charging the apparatus (11) with a plurality of stacks of annular porous carbon preforms (5), the preforms being separated from one another by spacers (15); (c) locating the charged apparatus (11) in a furnace at a temperature in the range of 950-1100° C. and a pressure in the range of 5-40 torr; and (d) circulating a natural gas reactant blended with up to 15% propane through the apparatus for a period of from 150 to 900 hours. Carbon-carbon composite preforms made by this method may be configured as aircraft landing system brake discs or racing car brake discs.

13 Claims, 8 Drawing Sheets

CHEMICAL VAPOR DEPOSITION METHOD

This invention relates generally to chemical vapor infiltration and deposition (CVI/CVD) processes, and more particularly to an apparatus that can be used to carry out highly uniform CVI/CVD processes.

BACKGROUND OF THE INVENTION

Chemical vapor infiltration and deposition is a well known technique for depositing a binding matrix within a porous structure. The terminology "chemical vapor deposition (CVD) generally implies deposition of a surface coating, but the terminology is also used to refer to infiltration and deposition of a matrix within a porous structure. As used herein, the terminology "CVI/CVD" refers to infiltration and deposition of a matrix within a porous structure. This technique is suitable for fabricating high temperature structural composites by depositing a carbonaceous or ceramic matrix within a carbonaceous or ceramic porous structure composed of fibers, and is particularly valuable in the manufacture of useful structures such as carbon-carbon composite racing car and aircraft brake discs.

Generally speaking, manufacturing carbon parts using a CVI/CVD process involves placing preformed porous structures in a furnace and introducing a high temperature reactant gas to the porous structures. When carbon-carbon aircraft brake discs are being manufactured, fibrous carbon porous structures typically are treated with a reactant gas mixture of natural gas, often enriched with some propane gas. When the hydrocarbon gas mixture flows around and through the porous structures, a complex set of dehydrogenation, condensation, and polymerization reactions occur, thereby depositing the carbon atoms within the interior and onto the surface of the porous structures. Over time, as more and more of the carbon atoms are deposited onto the structures, the porous structures become more dense. This process is sometimes referred to as densification, because the open spaces in the porous structures are eventually filled with a carbon matrix until generally solid carbon parts are formed.

As is well known to those skilled in the art, critical control variables in chemical vapor infiltration and deposition processes include: preform temperature and pore structure; reactant gas composition, flow rate, temperature, and pressure; and reaction time. The surface reaction of deposition of carbon is an exponential function of the preform temperature. The process therefore is very sensitive to this parameter. Maintaining a controlled uniform temperature throughout the furnace in which preforms are being treated is critical to achievement of consistent densification results.

Based upon these critical control variables, CVI/CVD processes may be broadly classified as:
(1) Conventional—isothermal and isobaric;
(2) Thermal gradient (for example, U.S. Pat. No. 5,348,774); and
(3) Pressure gradient or forced flow (for example, U.S. Pat. No. 5,480,678).

The present invention relates to the conventional process, which is designed to maintain the preform temperature at a constant (isothermal) with no significant pressure differentials in the furnace (isobaric). In conventional densification, annular brake discs are arranged in stacks with adjacent brake discs stacked on top of one another. A center opening region is thus formed through the center of each stack. As may be seen e.g. in FIG. 2 of U.S. Pat. No. 6,669,988 B2, on the order of a dozen stacks may be located together in a densification furnace. As may be seen e.g. in FIG. 5 of U.S. 2003/0118728 A1, each stack may contain on the order of two score brake disc preforms. Graphite or carbon-carbon spacers are placed between adjacent brake discs to form open passages between the center opening region and the outer region. The reactant gas flows randomly around the stack and may flow through the open passages from the center opening region to the outer opening region or vice versa, with no significant pressure gradients. The stacks may or may not be confined within graphite or carbon-carbon cylindrical structures. Conventional densification treatments are generally conducted for several hundreds of hours.

In conventional processing, the intent is to maintain all of the brake discs at a constant temperature during the process ("isothermal"). This is not, however, successfully achieved in many applications. For instance, the heat source is from the outer diameter of the cylindrical vessel in all of the depictions of the process in U.S. Pat. No. 5,904,957 and U.S. Pat. No. 6,669,988 B2. In such embodiments of the so-called isothermal process, the heat transfer to the stacks located in the center of the furnace is not the same as is the heat transfer to the stacks located near the walls. This results in the center stacks not densifying to the same extent as do the stacks near the walls, which results in the need for additional correction cycles and/or in a potential for undesired microstuctures impacting cost and perhaps variability in friction performance of the brakes.

U.S. Pat. No. 5,904,957 places stacks of annular preforms in a furnace with spacer elements between each of the preforms and between the last preforms in the stacks and the screens at the top end, thus forming leakage passages between adjacent preforms. The gas is then channeled towards only the interior passage of each annular stack at the bottom. The top end of the stacks is closed by solid screens. One disadvantage of this method is that the outer surfaces of the brake disc near the bottom of the stacks may become starved for gas, thereby producing an undesirable densification of the bottom brake discs and non-uniformity between the bottom and top brake discs. Another disadvantage is that the closed top ends of the stacks blocks the gas flow out of the top ends, thus causing gas stagnation problems resulting in seal-coating as well as in undesirable microstructure.

U.S. Pat. Nos. 5,480,678 and 6,109,209 describe an invention said to be particularly suited for the simultaneous CVI/CVD processing of hundreds of aircraft brake discs. This invention includes a gas preheater for use in a CVI/CVD furnace that receives a reactant gas from a gas inlet. A sealed baffle structure is disposed within the furnace. The sealed baffle structure has a baffle structure inlet and a baffle structure outlet. A sealed duct structure is disposed within the furnace, with the sealed duct structure being sealed around the gas inlet and the baffle structure, so that substantially all of the reactant gas received from the gas inlet is directed to and forced to flow through the sealed baffle structure to the baffle structure outlet.

Another method of achieving uniform temperatures in the center stacks is via preheating the reactant gas. This method is described in U.S. 2003/0118728 A1. The reactant gas is typically admitted into the furnace under ambient conditions with a residence time in the furnace on the order of seconds. As is known to those skilled in the art, preheating the gas to near the temperature of the brake discs results in secondary gas phase reactions forming undesirable side products, such as soot and tar, which accumulate on the surfaces of the brake discs and/or on the furnace equipment. Accumulations of soot and tar can cause a number of problems which adversely affect the quality of the brake discs and the cost of manufacturing.

Seal-coating is one typical problem than can result from soot and tar accumulation, although seal-coating can also be caused by other conditions, such as stagnation as described below. The seal-coating results in blocking of surface pores, thus preventing the flow of reactant gas from further infiltrating the occluded porosity in the preform. Surface machining and additional correction cycles become necessary to achieve the required density, increasing cost and reducing uniformity. Accumulations of soot and tar can also make disassembly of intricate close-fitting parts especially difficult, since the tar tends to bind the parts tightly together. The maintenance costs associated with such complex fixtures building up tar over a period of time can be substantial.

SUMMARY OF THE INVENTION

This invention provides an apparatus in which porous preforms may be stacked to be densified by CVI/CVD processing. The apparatus of the present invention is typically a furnace muffle. A muffle is a chamber that maintains temperature uniformity and the integrity of the atmosphere in a heat treating application. A key feature of the inventive apparatus herein is the presence of a passive heat distribution element in the interior of the furnace muffle. The passive heat distribution element is composed either of a thick graphite shaft or of a thick previously densified carbon-carbon shaft. This passive heat distribution element may be solid. Preferably, however, it is a hollow cylinder, filled, for instance, with annular graphite rings or with previously densified C-C filler discs arranged with no spacers between them.

During the densification process, the passive heat distribution element absorbs a large portion of the heat in the furnace and radiatively and uniformly distributes the heat to the surrounding preform stacks. The gaps between the walls of the apparatus and the preform discs are preferably kept small, so that the reactant gas flows uniformly around the preform discs being densified, and is forced through the preforms. This invention provides greater and more uniform weight pickup throughout the stacks. That is, in accordance with this invention, all of the preforms in a given densification batch are more uniform in density than are the preforms in a comparable batch made by a process that has no heat distribution element in the center of the furnace muffle. This uniformity results in a higher overall average density for the batch of preforms.

One embodiment of the present invention is an apparatus (11), typically a furnace muffle, for use in a CVI/CVD furnace. The apparatus includes a bottom (12), a top (13), and an outer wall (3) defining an interior space (1) in the apparatus, and a passive heat distribution element (7, 9) located within the interior space (1) and apart from the outer wall (3). Preferably, the bottom (12) and top (12) include perforated plates and the outer wall (3) is cylindrical in shape and all are made of graphite or carbon-carbon composite material and the passive heat distribution element (7, 9) is cylindrical in shape and includes graphite or carbon-carbon composite discs having no spacers therebetween.

Another embodiment of the present invention is a method for densifying a porous carbon preform (5). This method includes the steps of: providing the apparatus (11); charging the apparatus (11) with a plurality of stacks of annular porous carbon preforms (5), the preforms being separated from one another by spacers (15); locating the charged apparatus (11) in a furnace at a temperature in the range of 950-1100° C. and a pressure in the range of 5-40 torr; and circulating a natural gas reactant blended with up to 15% propane through the apparatus for 150-900 hours. The preforms densified in this manner may be configured, for instance, as aircraft landing system brake discs or as Formula One racing car brake discs.

In yet another embodiment, the present invention provides a batch of carbon-carbon composite preforms made by the above method. In accordance with this invention, the density of a batch of preforms so made is at least 0.5 g/cc higher than the density of a batch of preforms made by an otherwise identical process in which the apparatus does not contain a passive heat distribution element located within its interior.

BRIEF DESCRIPTION OF THE DRAWINGS

The present invention will become more fully understood from the detailed description given hereinbelow, and from the drawings that accompany this application. These drawings are provided by way of illustration only and should not be construed as limiting the invention.

DETAILED DESCRIPTION OF THE INVENTION

Densification. The apparatus of this invention is especially useful for carbon densification of annular porous structures used for high performance brake discs. The apparatus supports and positions a number of brake discs which are stacked on top of each other in a number of stacks. During the densification process, the apparatus and stacks of discs are enclosed in a furnace. Hot hydrocarbon gases are caused to flow around and through the stacks of brake discs, thereby depositing a carbon matrix within the interior regions and on the surface of the porous brake disc structures. The absolute gas pressure for the furnace is typically about 5-40 torr, the temperature range is typically about 950-1100° C., and the densification time is typically from 150 to 900 hours. A variety of different types of gas may be used. One may use for instance 100% natural gas. Natural gas typically comprises 92-96% methane, up to 5% ethane, up to 1% propane, up to 0.5% butane, and very small amounts of pentane and hexane. Alternatively to the use of natural gas alone, one may use a blend of natural gas with up to about 15% propane, e.g. 98% natural gas and 2% propane or 87% natural gas and 13% propane.

Among the types of furnaces that may be used for a CVI/CVD process in accordance with this invention is an induction furnace or a resistively heated furnace that includes tubular furnace walls enclosing the apparatus of this invention. This furnace would also have inlet ducts and outlet ducts for introducing and exhausting the gas mixture into and out of the furnace. A preheater may also be provided within the furnace to heat the gas before the gas is directed to the porous preforms. Typically, the preheater is sealed and the incoming gas from the inlet ducts is received by the preheater before being introduced into the apparatus of this invention. The preheated gas is then discharged from the preheater through discharge openings in the furnace floor plate of the preheater. Full details of such a furnace assembly may be found in U.S. Pat. No. 6,669,988 B2, the entire disclosure of which is hereby expressly incorporated by reference.

The Present Apparatus. In more detail, this invention provides an apparatus for use in a CVI/CVD furnace. The apparatus of this invention may be a furnace muffle. The apparatus has a bottom, a top, and an outer wall defining an interior space in the apparatus, and a passive heat distribution element located within the interior and apart from the outer wall. The outer wall of the apparatus may conveniently be cylindrical in shape and the top and bottom of the apparatus may conveniently be planar. Generally the passive heat distribution element will be located in the center of the interior space. The passive heat distribution element may conveniently b cylindrical in shape. In accordance with this invention, the passive heat distribution element will have a mass in the range of 200-600 kilograms. A typical mass for the passive heat distribution element is about 300 kilograms.

In the apparatus of this invention, the bottom, top, and outer walls will generally comprise graphite or carbon-carbon composite material. Without limitation, in specific embodiments of the present invention, the outer wall of the furnace muffle may be 1 inch thick and 57 inches in internal diameter. Typically, the bottom and top walls will be perforated, in order to facilitate the passage of gases involved in the densification process. Like the walls, the passive heat distribution element will also, independently, comprise graphite or carbon-carbon composite. For example, the passive heat distribution element may be constituted of a stack of carbon-carbon composite annular rings having no spacers between them. See FIG. 5. Another embodiment of this approach may be constituted of a stack of carbon-carbon composite discs, also unspaced, e.g. 18 inches in diameter. Alternatively, the passive heat distribution element may be constituted of carbon-carbon composite material that fills a cylindrical member located within the furnace muffle. See FIGS. 1 and 2. The wall of the cylindrical member could be, for instance, $\frac{1}{16}$ to $\frac{1}{2}$ inch in thickness and 21 to 22 inches in external diameter. Those skilled in the art will readily conceive of many different sizes and many different ways in which to provide a passive heat distribution element in accordance with the principles of this invention. An important characteristic of the passive heat distribution element for most preform densification applications contemplated herein, however, is that its mass should amount to at least about 200 kilograms.

In use, the apparatus of this invention will have located therein a plurality of stacks of annular porous carbon preforms. The preforms could be configured as aircraft landing system brake discs or as racing car brake discs or in some other useful form. On the order of a dozen stacks will often be located together in a densification furnace, although fewer or more may be treated in accordance with the principles discussed herein. Each stack may contain on the order of two score brake disc preforms, although again shorter or taller stacks may be treated in the present invention. As those skilled in the art will appreciate, the preforms charged into the furnace muffle for densification will generally be separated from one another by spacers.

Uniformly Densified Preforms. The method for densifying a porous carbon preform contemplated by this invention makes use of an apparatus as described above. The apparatus is charged with a plurality of stacks of annular porous carbon preforms, with the preforms normally being separated from one another by spacers. The apparatus charged with the stacks of porous carbon preforms is located in a furnace. The temperature used for densification is normally in the range of 950-1100° C. and the pressure is normally in the range of 5-40 torr. Densification is accomplished by circulating a natural gas reactant, which may be blended with up to 15% propane—e.g., 96.5% natural gas and 3.5% propane—through the apparatus. The densification process can be run for as little as 150 hour to as long as 900 hours.

This invention provides highly uniform batches of carbon-carbon composite preforms. In accordance with the present invention, the density of a batch of preforms prepared by the method of this invention is generally at least 0.5 g/cc higher than the density of a batch of preforms made by an otherwise identical process in which the apparatus employed for densification does not contain a passive heat distribution element as described herein located within its interior.

FIGS. 1-8

Figure 1:
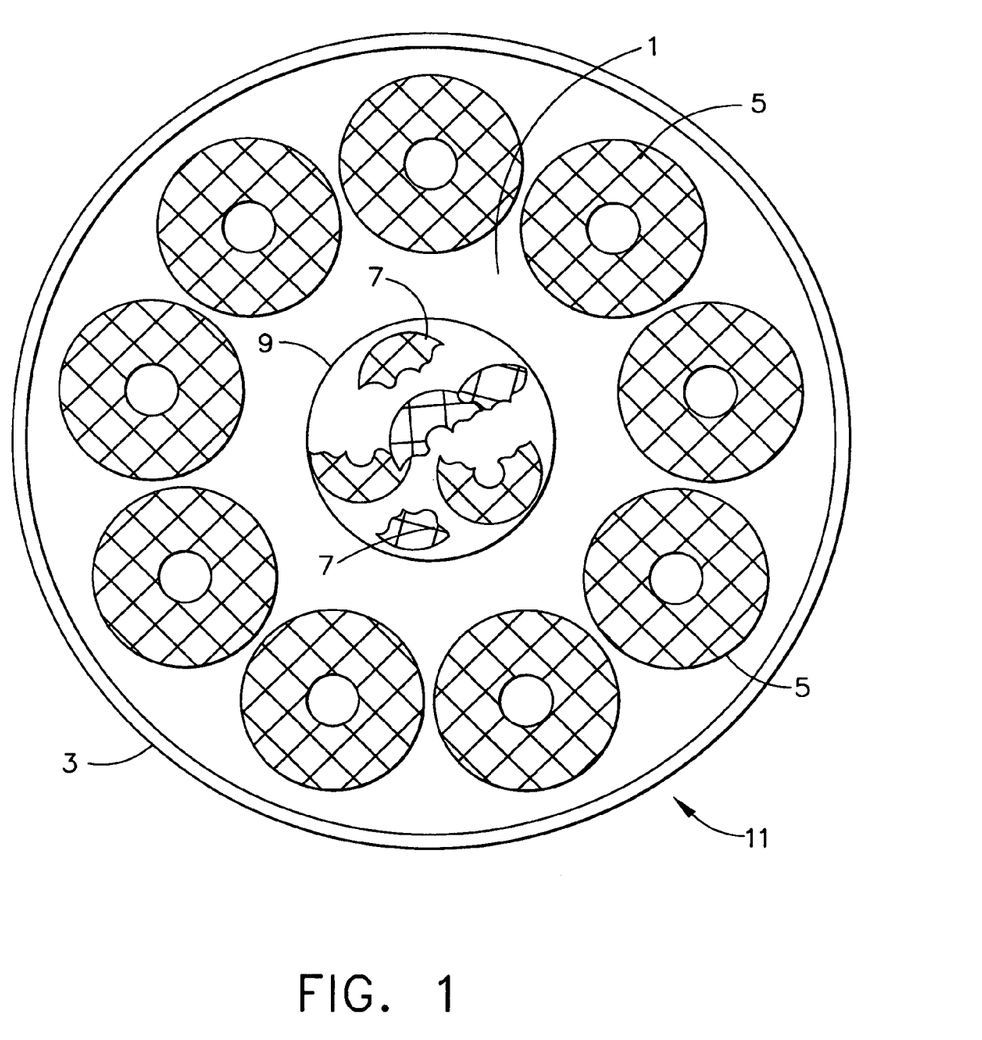
FIG. 1 is a schematic top plan view of an apparatus of the present invention.

As depicted in the top plan view of FIG. 1, the apparatus 11 of this invention may comprise a space 1 defined by an outer wall 3 and an inner wall 9. Located within the space are a plurality of stacks of preforms 5. Located within a space defined by inner wall 9 is passive heat distribution element material 7. The passive heat distribution element contemplated by the present invention may be a solid core or may be composed of material 7 located within an inner wall 9. Inner and outer walls 3 and 9 can be made of any suitable material, such as graphite or carbon-carbon composite. The passive heat distribution element can be made of any material that will provide the apparatus with an inner source of heat at a level comparable to the heat being provided to the whole apparatus by the furnace. An especially convenient passive heat distribution element material is carbon-carbon composite material.

In conventional CVI/CVD processing, the passive heat distribution element will be in the form of a cylinder approximately 18 to 20 inches in diameter. The interior of the cylinder will be filled, for instance, with solid carbon-carbon composite discs, or with annular carbon-carbon composite rings having internal diameters of 12 inches. A key feature of the passive heat distribution element is its mass. In accordance with this invention, the passive heat distribution element will generally have a mass of at least 200 kg, and could range in mass up to 600 kg or more. In a typical embodiment of the present invention, the passive heat distribution element will have a nominal mass of about 300 kg.

Figure 2:
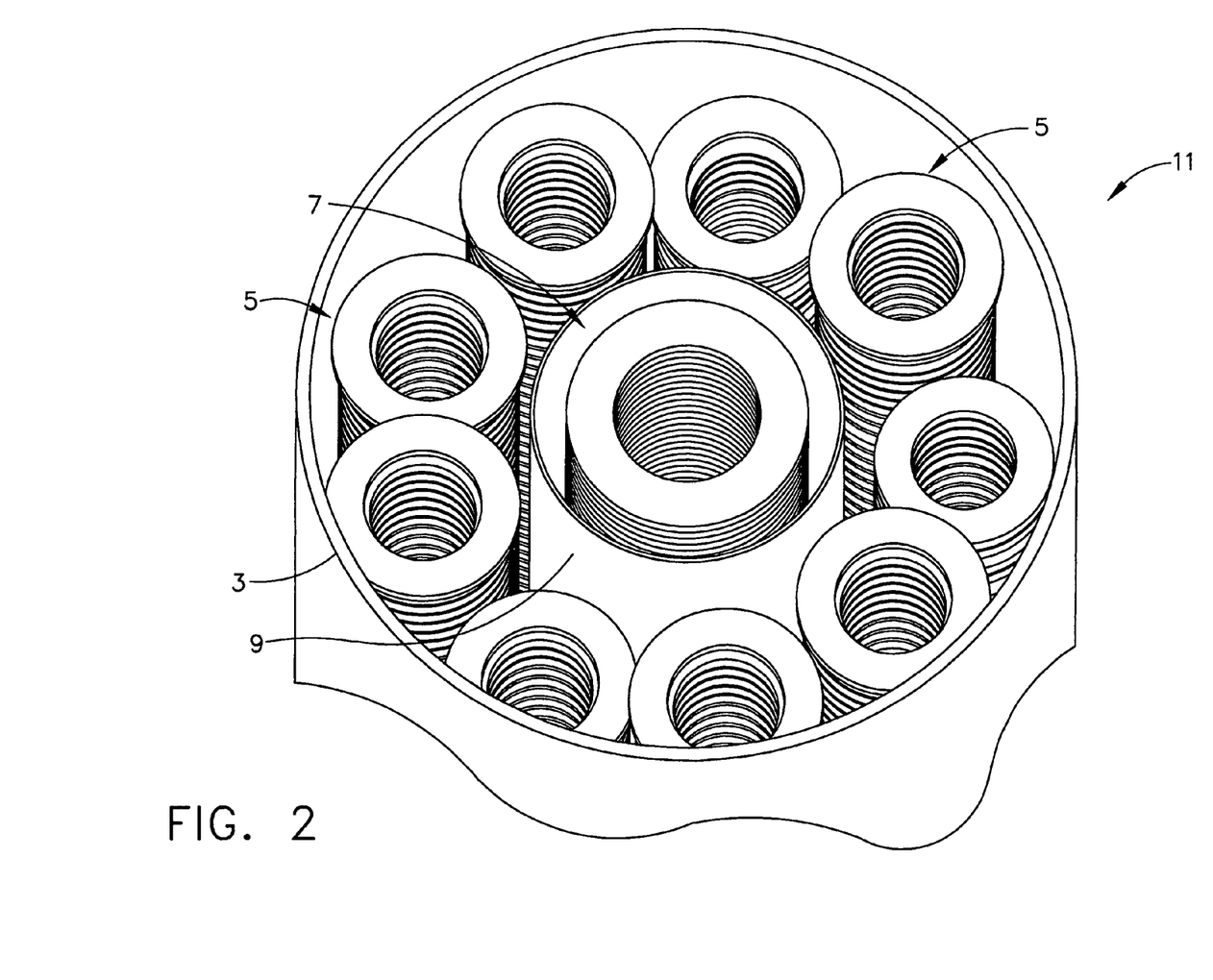
FIG. 2 shows a partial perspective view of an apparatus of the present invention.

FIG. 2 shows a partial perspective view of apparatus 11. Outer and inner walls 3 and 9 each comprises graphite or carbon-carbon composite material. In FIG. 2, graphite or carbon-carbon composite heat distribution element material 7 is shown as completely filling the spaced defined by inner wall 9. Also visible in FIG. 2 are carbon-carbon composite preform stacks 5.

In a typical embodiment of apparatus 11, outer wall 3 is 2 inches thick and 57 inches in internal diameter and inner wall 9 is 1/16-1/2 inch thick and 21-22 inches in external diameter. Typical diameters of preforms 5 are 11.5 inches and 16 inches.

Figure 3:
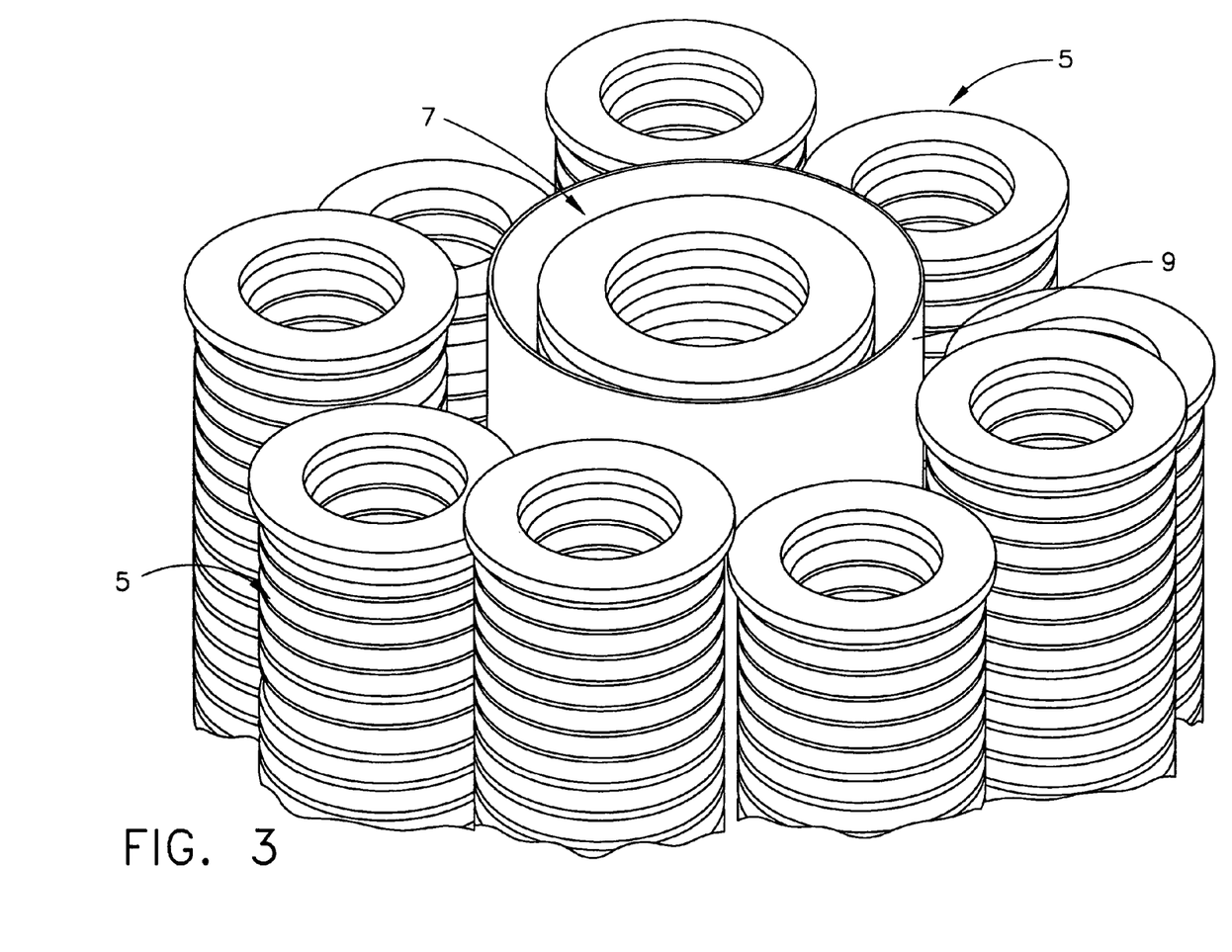
FIG. 3 is a partial perspective view of stacks of preforms as they would be loaded in an apparatus of the present invention.

FIG. 3 is a partial perspective view of stacks 5 surrounding inner wall 9. In FIG. 3, heat distribution element material 7 is made up of densified carbon-carbon composite preforms. It should be noticed that while the undensified preforms in stacks 5 are separated from one another by spacers, the densified carbon-carbon composite preforms that constitute heat distribution element material 7 are not separated from one another.

Figure 4:
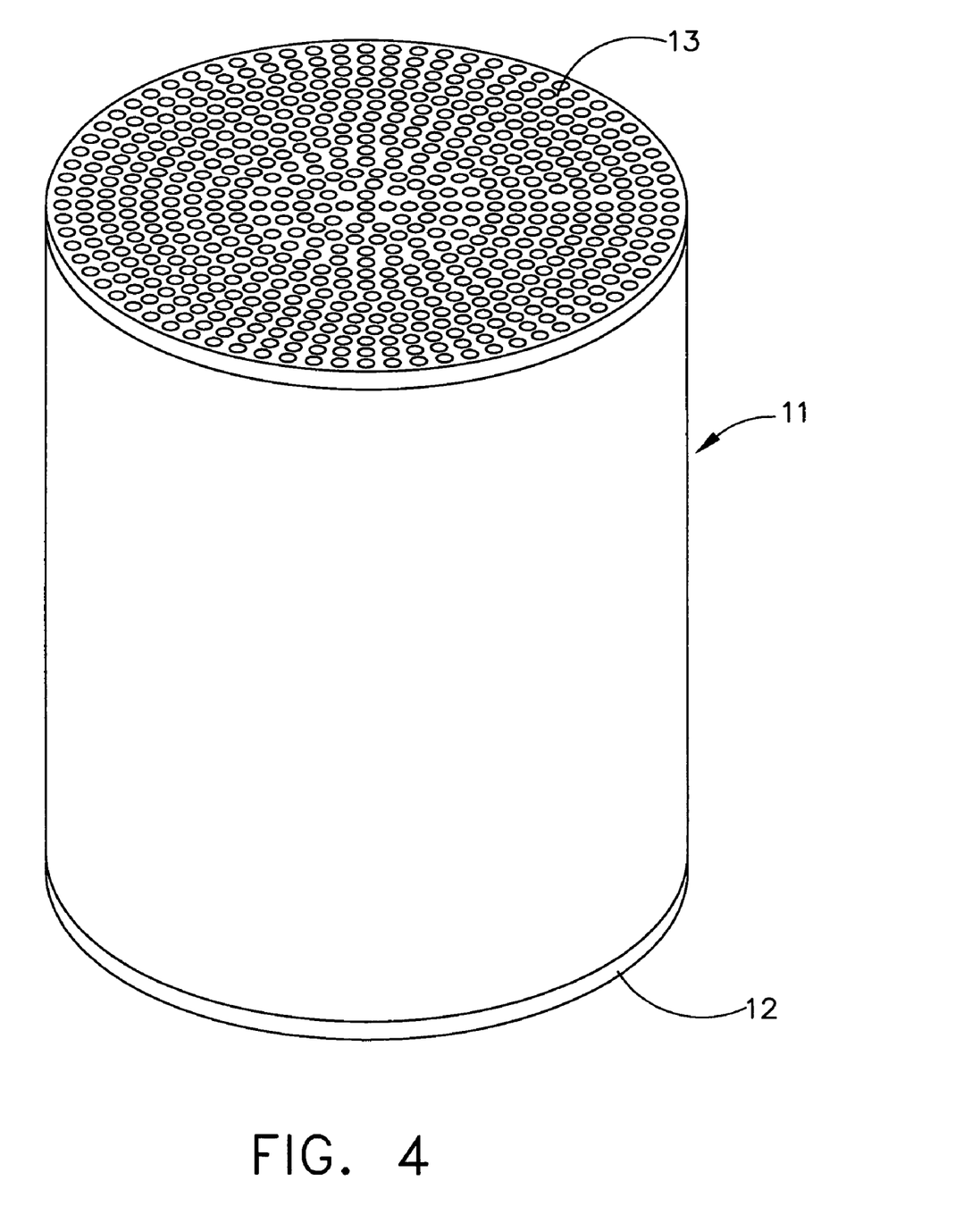
FIG. 4 is a perspective view of a fully enclosed apparatus of the present invention.

FIG. 4 is a perspective view of inventive apparatus 11. Both the bottom and the top of apparatus 11 are closed by a perforated plate, 12 and 13, respectively, made of a suitable material such as graphite or carbon-carbon composite. The perforated plates permit the entrance of carbon-containing gas into space 1 (not shown), as well as the exit of waste gases, during CVI/CVD processing.

Figure 5:
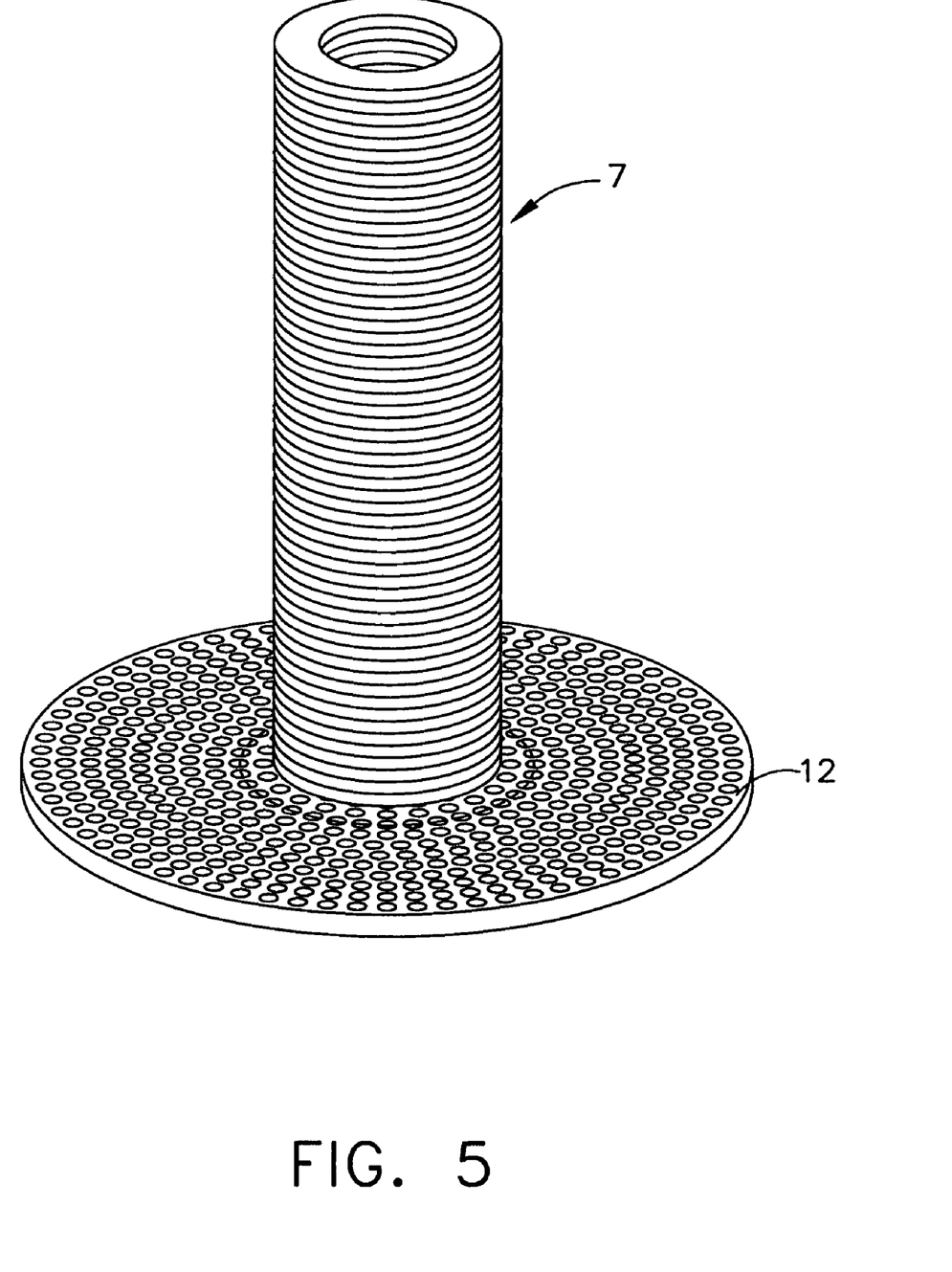
FIG. 5 is a perspective view showing a heat distribution element that may be used in accordance with the present invention.

FIG. 5 is a perspective view of perforated bottom plate 12, showing heat distribution element material 7 located thereupon.

Figure 6:
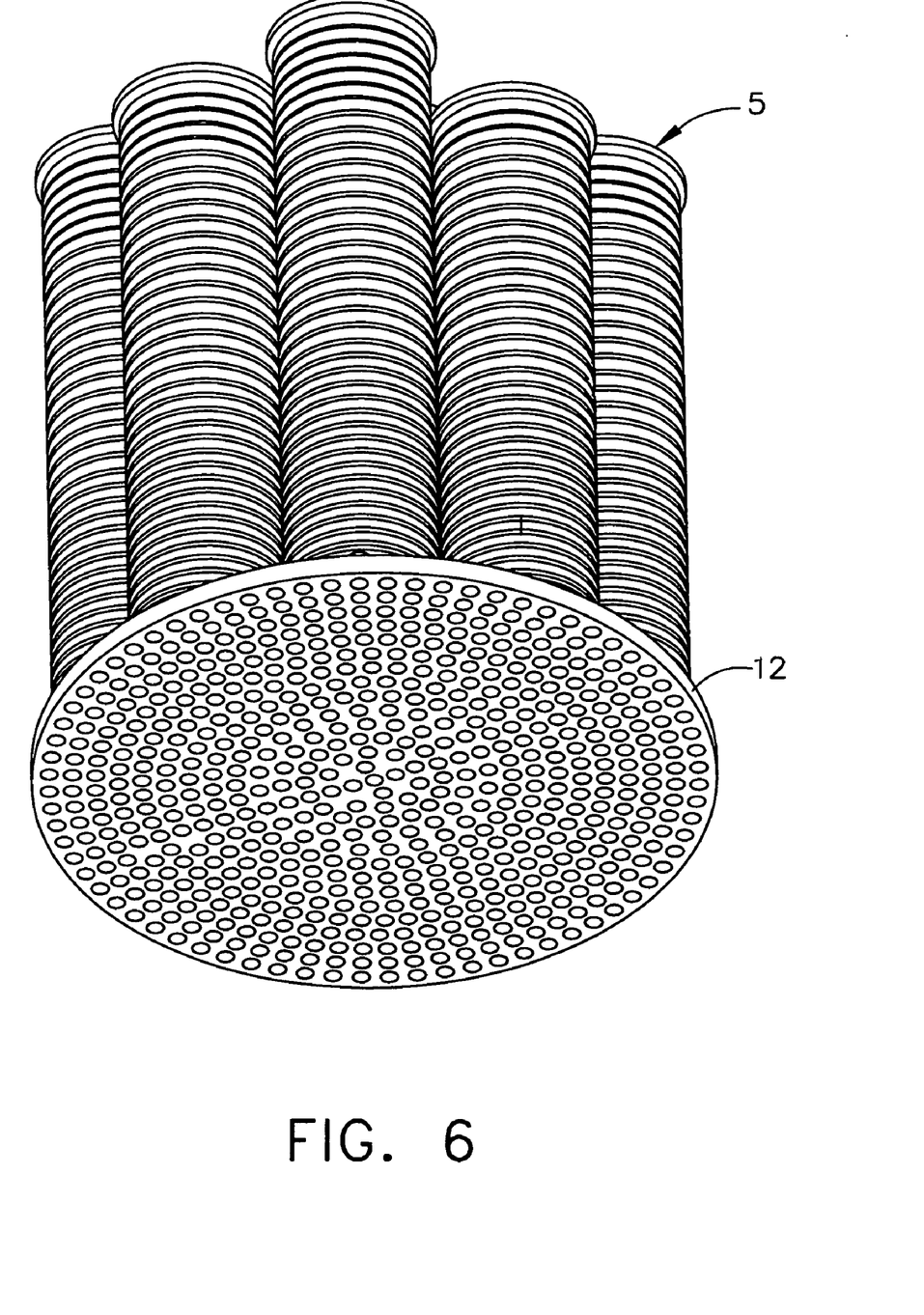
FIG. 6 is a perspective view of a bottom plate with preform stacks located thereupon.

FIG. 6 is a perspective view of perforated bottom plate 12, showing preform stacks located thereupon.

Figure 7:
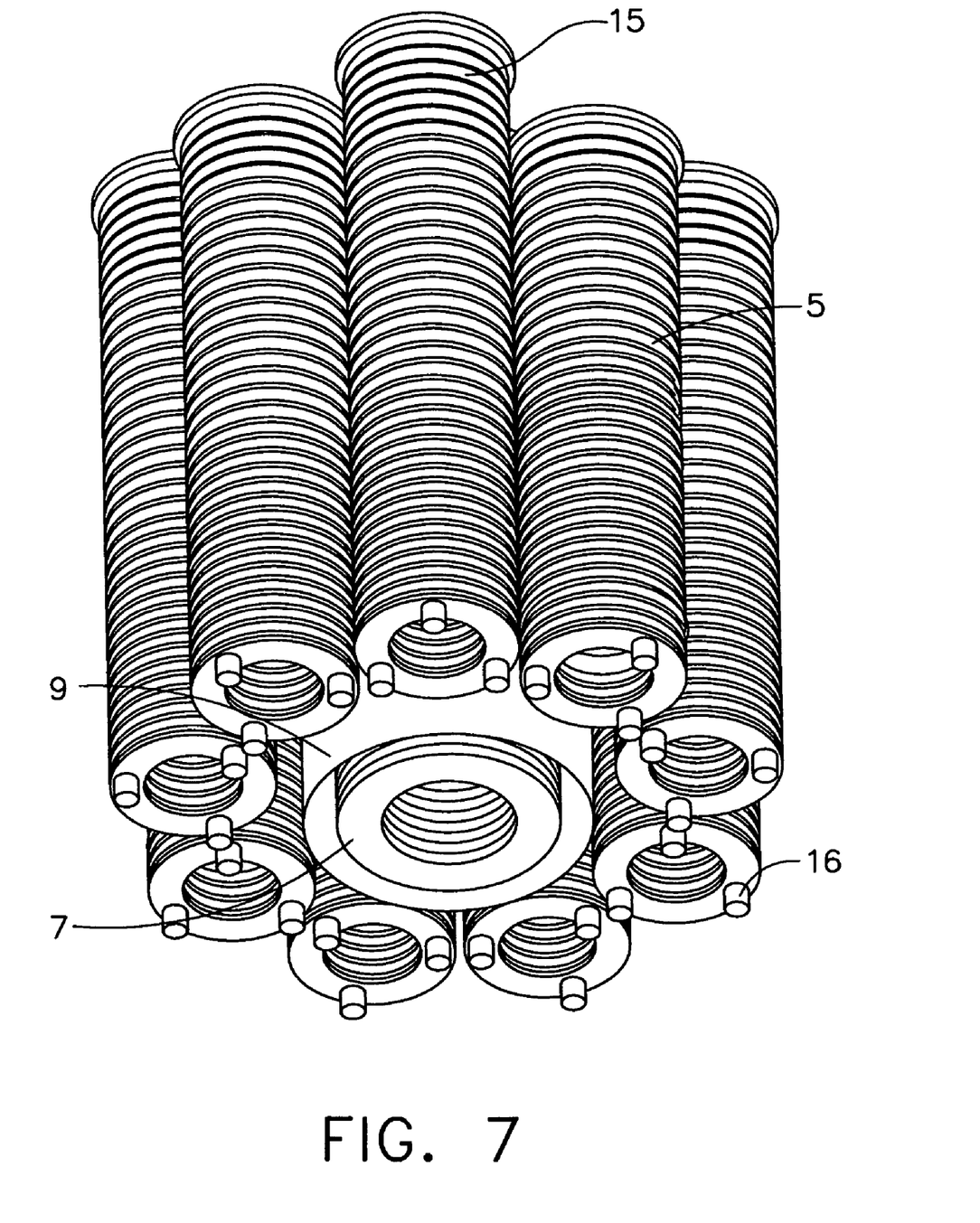
FIG. 7 is a perspective view of preform stacks arranged around inner wall which surrounds a passive heat distribution element.

FIG. 7 is a perspective view of preform stacks 5 arranged around inner wall 9 which surrounds passive heat distribution element material 7. At the bottom of each preform stack are three legs 16 which serve to separate the preform stack from bottom plate 12 during CVI/CVD processing. Also in FIG. 7 one can see a chain of spacers 15. Chain of spacers 15 provides spacers between each of the preforms in a stack. Each stack has from four to eight spacer chains for supporting the preforms. These spacer chains, which are well known to those skilled in the art, operate not only to space the preforms in a given stack from one another but also to facilitate handling of a stack of preforms as a unit when arranging it in and removing it from the CVI/CVD apparatus.

Figure 8:
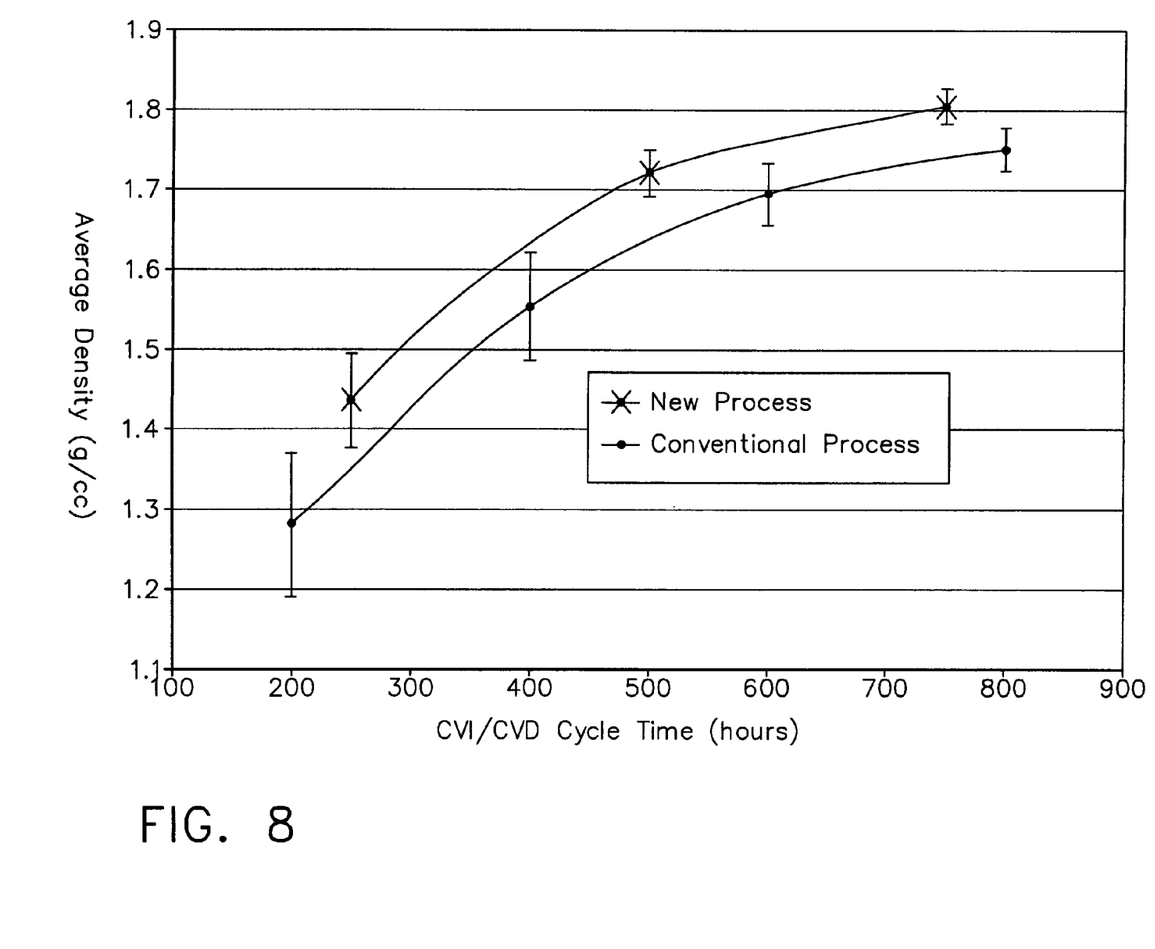
FIG. 8 depicts graphically an increase in overall preform density provided by the present invention.

FIG. 8 depicts graphically the increase in overall preform density provided by the present invention. FIG. 8 shows that for similar CVI/CVD cycle times, the novel process of the present invention provides higher average preform densities than does a conventional process, that is, a process conducted in the absence of a passive heat distribution element.

What is claimed is:

1. A method for densifying a porous carbon preform, which method comprises the steps of:
    (a) providing an apparatus for use in a CVI/CVD furnace, said apparatus comprising a bottom, a top, and an outer wall defining an interior space in the apparatus, and a passive heat distribution element having a mass of at least about 200 kilograms located within said interior space and apart from said wall;
    (b) charging said apparatus with a plurality of stacks of annular porous carbon preforms, said preforms being separated from one another by spacers;
    (c) placing said charged apparatus in a furnace at a temperature in the range of 950-1100° C. and a pressure in the range of 5-40 torr; and
    (d) circulating a natural gas reactant blended with up to 15% propane through said apparatus for a period of time of from 150 to 900 hours.

2. The method of claim 1, wherein said natural gas reactant is 100% natural gas or is a blend of 96.5% natural gas and 3.5% propane.

3. The method of claim 1, wherein said apparatus is a furnace muffle in which said passive heat distribution element is centrally located.

4. The method of claim 1, wherein said passive heat distribution element has a mass in the range of 200-600 kilograms.

5. The method of claim 1, wherein the bottom and top of said apparatus are planar and the outer wall of said apparatus and said passive heat distribution element are cylindrical in shape.

6. The method of claim 1, wherein the bottom, top, and outer walls of said apparatus comprise graphite or carbon-carbon composite material and wherein said passive heat distribution element comprises graphite or carbon-carbon composite discs having no spacers therebetween.

7. The method of claim 1, wherein the passive heat distribution element is carbon-carbon composite that fills a cylindrical member located within the furnace muffle.

8. The method of claim 7, wherein said cylindrical member ranges from 1/16 inch in thickness to 0.5 inch in thickness and from 21 to 22 inches in external diameter.

9. The method of claim 3, wherein an outer wall of said furnace muffle is 1 inch thick and 57 inches in internal diameter.

10. The method of claim 1, wherein said passive heat distribution element is 18 inches in diameter.

11. The method of claim 1, wherein the bottom and top of said apparatus comprise perforated plates.

12. The method of claim 1, wherein the annular porous carbon preforms are aircraft landing system brake discs.

13. The method of claim 1, wherein the annular porous carbon preforms are racing car brake discs.

* * * * *